US011562911B2

(12) United States Patent
Torresin et al.

(10) Patent No.: US 11,562,911 B2
(45) Date of Patent: Jan. 24, 2023

(54) POWER SEMICONDUCTOR MODULE AND METHOD OF FORMING THE SAME

(71) Applicant: Hitachi Energy Switzerland AG, Baden (CH)

(72) Inventors: Daniele Torresin, Baden (CH); Thomas Gradinger, Aarau Rohr (CH); Juergen Schuderer, Zürich (CH)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/630,091

(22) PCT Filed: Jul. 23, 2020

(86) PCT No.: PCT/EP2020/070855
§ 371 (c)(1),
(2) Date: Jan. 25, 2022

(87) PCT Pub. No.: WO2021/013956
PCT Pub. Date: Jan. 28, 2021

(65) Prior Publication Data
US 2022/0254654 A1    Aug. 11, 2022

(30) Foreign Application Priority Data

Jul. 25, 2019    (EP) ..................... 19188379

(51) Int. Cl.
*H01L 21/48*    (2006.01)
*H01L 23/367*    (2006.01)
(Continued)

(52) U.S. Cl.
CPC .......... *H01L 21/4882* (2013.01); *H01L 23/10* (2013.01); *H01L 23/3675* (2013.01);
(Continued)

(58) Field of Classification Search
CPC ................ H01L 21/4882; H01L 23/10; Y10T 29/49144
See application file for complete search history.

(56) References Cited

U.S. PATENT DOCUMENTS 6,665,180 B2 *  12/2003  Lehman ................ H01L 23/473
                                                    257/E23.098
6,912,130 B2 *   6/2005  Osanai .................. C04B 37/026
                                                    361/689
(Continued)

FOREIGN PATENT DOCUMENTS

CN         1208960 A      2/1999
CN       102159357 A      8/2011
(Continued)

*Primary Examiner* — Dale E Page
*Assistant Examiner* — Abbigale A Boyle
(74) *Attorney, Agent, or Firm* — Slater Matsil, LLP

(57) ABSTRACT

One embodiment provides a method of providing a power semiconductor module with a cooler. A power semiconductor module includes a substrate having a first substrate side for carrying at least one electric circuit and having a second substrate side being located opposite to the first substrate side. The second substrate side is connected to a first baseplate side and the baseplate also includes a second baseplate side being located opposite to its first baseplate side and being adapted for coming in contact with the cooler. The cooler includes a first casing component and a second casing component. The baseplate side is equipped with a cooling area that is surrounded by a connecting area.

10 Claims, 3 Drawing Sheets

(51) Int. Cl.
*H01L 23/473* (2006.01)
*H01L 23/10* (2006.01)

(52) U.S. Cl.
CPC ........ *H01L 23/3677* (2013.01); *H01L 23/473* (2013.01); *Y10T 29/49144* (2015.01)

(56) References Cited

U.S. PATENT DOCUMENTS

| | | | |
|---|---|---|---|
| 8,369,090 B2 * | 2/2013 | Chester | H05K 7/20763 |
| | | | 165/80.4 |
| 9,578,789 B2 | 2/2017 | Uhlemann et al. | |
| 2010/0084748 A1 | 4/2010 | Poddar et al. | |
| 2010/0206537 A1 | 8/2010 | Ikeda et al. | |
| 2013/0285234 A1 | 10/2013 | Uhlemann et al. | |
| 2014/0347818 A1 | 11/2014 | Uhlemann et al. | |
| 2015/0061112 A1 | 3/2015 | Bogen et al. | |
| 2020/0350232 A1 * | 11/2020 | Gradinger | H01L 21/4882 |

FOREIGN PATENT DOCUMENTS

| | | | |
|---|---|---|---|
| CN | 103378021 A | | 10/2013 |
| CN | 104183561 A | | 12/2014 |
| CN | 104425406 A | | 3/2015 |
| CN | 207165550 U | | 3/2018 |
| DE | 102016203184 A1 | | 5/2017 |
| JP | 2008300450 A | | 12/2008 |
| JP | 2013045781 A | | 3/2013 |
| JP | 2015210032 A | * | 11/2015 |
| WO | 2015176194 A1 | | 11/2015 |

* cited by examiner

POWER SEMICONDUCTOR MODULE AND METHOD OF FORMING THE SAME

CROSS-REFERENCE TO RELATED APPLICATIONS

This application is a national stage application of International Application No. PCT/EP2020/070855, filed on Jul. 23, 2020, which claims priority to European Patent Application No. 19188379.2, filed on Jul. 25, 2019, which applications are hereby incorporated herein by reference.

TECHNICAL FIELD

The present invention relates to a power semiconductor module and a method of forming the same.

BACKGROUND

Power semiconductor modules are well known in the art in different applications.

As an example, it is known to position electric circuits soldered on substrates in a housing and encapsulate the electric circuits in a resin which is filled in the housing.

However, transfer-molded and particularly sintered power modules have become an interesting alternative to the traditional approach because of the increased cycle reliability of the power module. Nevertheless, this adds more complexity for the integration of the electric circuit such as comprising three phases on a common baseplate or cooler. Whereas substrates can be fully assembled with wire bonds when heading for subsequent substrate soldering, substrates for sintering cannot or only hardly be wire bonded and tested prior to sintering, since the sintering approach requires a strong pressure on the substrates. The pressure is typically applied mechanically with a rubber stamp, which would destroy the wire bonding.

For this reason, the one-step sintering of a six-pack module, for example, is economically very risky. The preferable solution is to head for a six-pack configuration made by three different transfer-molded and sintered half bridge modules.

However, there are different issues to be regarded when using transfer molded modules.

For example, the integration by using O-ring has room for improvements for reliability reasons, such as due to aging of the O-ring. The usage of screws requires storage and part numbers for the assembly line. Furthermore, this solution requires space for the screws and O-rings due to the amount of screws and O-rings, such as four screws and O-rings for a half-bridge module.

It is important that the method or technology used for the integration of the electric circuits must not damage the power modules. In particular, it may be preferred that the temperature does not exceed 225° C. in order not to damage the mold compound. Further, mechanical stresses should be avoided.

It further should be avoided that integration by welding technologies generates small cracks and pores that cause leakage.

Apart from that, a fluid enclosure of a fluid-based cooler should be robust and leak tight, and at the same time the design should be space saving and cheap.

DE 10 2016 203 184 A1 discloses a power electronics assembly comprising: a power electronics unit; a first component of a first metal or a first metal alloy for the protection of the power electronics unit; a second component of a second metal or a second metal alloy for the protection of the power electronics unit; a metallic membrane; wherein the membrane connects the first and the second component with each other physically and fluid-tight.

However, connecting a substrate being part of a transfer molded power semiconductor module is still an issue. The prior art thus gives room for improvements with this regard.

SUMMARY

The present invention relates to a power semiconductor module and a method of forming the same. Particular embodiments relate to a power semiconductor module having an improved connection of a substrate to a cooler.

Embodiments of the present invention provide a solution for overcoming at least one disadvantage of the prior art at least in part. Particular embodiments provide a solution for reliably connecting a power semiconductor module to a cooler in a simple manner, thereby allowing an effective electrical insulation.

One embodiment provides a method of providing a power semiconductor module with a cooler. A power semiconductor module comprises a substrate having a first substrate side for carrying at least one electric circuit and having a second substrate side being located opposite to the first substrate side. The second substrate side is connected to a first baseplate side and the baseplate further comprises a second baseplate side being located opposite to its first baseplate side and being adapted for coming in contact with the cooler. The cooler comprises a first casing component and a second casing component. The baseplate side is equipped with a cooling area that is surrounded by a connecting area;

The first casing component is connected to the second baseplate side at the connecting area. The first casing component comprises at least one opening for receiving the cooling area. A second casing component is connected to the first casing component such that a cooling channel for providing the cooling area with cooling fluid is provided between the first casing component and the second casing component.

In one embodiment, the first casing component is connected to the second component by welding the first casing component to the baseplate by an intermittent welding technique along a first mechanical connection path which fully surrounds the opening. A sealing agent is applied along a first sealing path which fully surrounds the opening in order to seal the baseplate against the first casing component.

In an alternate embodiment, the first casing component is connected to the second component by welding the second casing component to the first casing component by an intermittent welding technique along a second mechanical connection path which fully surrounds the cooling channel. A sealing agent is applied along a second sealing path in order to seal the first casing component against the second casing component. The embodiments can be combined.

Another embodiment provides an arrangement of a power semiconductor module and a cooler. The power semiconductor module comprises a substrate having a first substrate side which carries at least one electric circuit and having a second substrate side being located opposite to the first substrate side. The second substrate side is connected to a first baseplate side. The baseplate further comprises a second baseplate side being located opposite to its first baseplate side and being in contact with the cooler. The second baseplate side is equipped with a cooling area which is surrounded by a connecting area. A first casing component of the cooler is connected to the second baseplate side at the connecting area. The first casing component comprises at least one opening for receiving the cooling area. A second casing component is connected to the first casing component such that a cooling channel for providing the cooling area with cooling fluid is provided between the first casing component and the second casing component.

In one embodiment and the second casing component, the first casing component is welded to the baseplate by an intermittent welding technique along a first mechanical connection path which fully surrounds the opening and a sealing agent is provided completely along a first sealing path fully surrounding the opening in order to seal the baseplate against the first casing component. In another embodiment, the second casing component is welded to the first casing component by an intermittent welding technique along a second connection path which fully surrounds the cooling channel and a sealing agent is provided completely along a second sealing path in order to seal the first casing component against the second casing component. These embodiments can be combined.

Other embodiments are disclosed in the further description as well as in the figures. The described embodiments can, alone or in any combination of the respective embodiments, provide a feature of the present invention unless not clearly excluded.

BRIEF DESCRIPTION OF DRAWINGS

These and other aspects of the invention will be apparent from and elucidated with reference to the embodiments described hereinafter. Individual features disclosed in the embodiments con constitute alone or in combination an aspect of the present invention. Features of the different embodiments can be carried over from one embodiment to another embodiment.

In the drawings.

DETAILED DESCRIPTION OF ILLUSTRATIVE EMBODIMENTS

Figure 1:
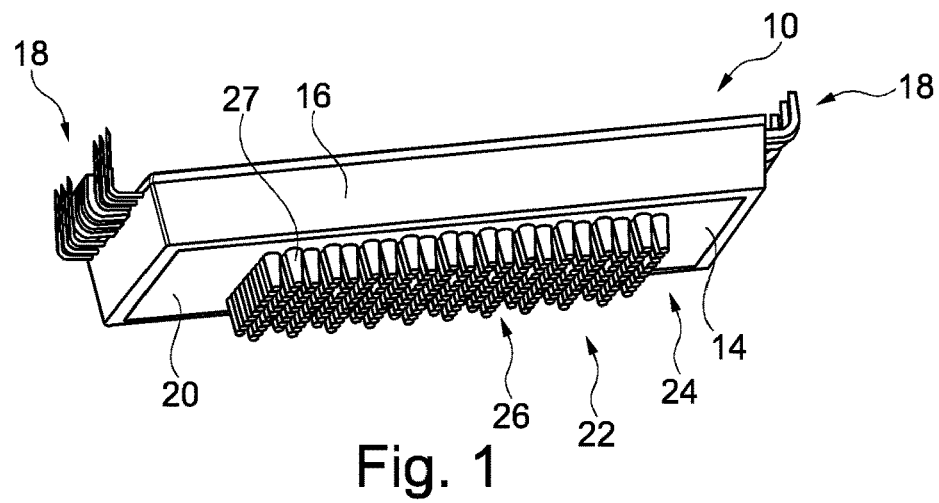
FIG. 1 shows an embodiment of a power semiconductor module.

Embodiments will be described followed by specific examples with respect to the drawings.

One embodiment provides a method of providing a power semiconductor module with a cooler. A power semiconductor module comprises a substrate having a first substrate side for carrying at least one electric circuit and having a second substrate side being located opposite to the first substrate side. The second substrate side is connected to a first baseplate side and the baseplate further comprises a second baseplate side being located opposite to its first baseplate side and being adapted for coming in contact with the cooler. The cooler comprises a first casing component and a second casing component. The baseplate side is equipped with a cooling area that is surrounded by a connecting area;

The first casing component is connected to the second baseplate side at the connecting area. The first casing component comprises at least one opening for receiving the cooling area. A second casing component is connected to the first casing component such that a cooling channel for providing the cooling area with cooling fluid is provided between the first casing component and the second casing component.

In one embodiment, the first casing component is connected to the second component by welding the first casing component to the baseplate by an intermittent welding technique along a first mechanical connection path which fully surrounds the opening. A sealing agent is applied along a first sealing path which fully surrounds the opening in order to seal the baseplate against the first casing component.

In an alternate embodiment, the first casing component is connected to the second component by welding the second casing component to the first casing component by an intermittent welding technique along a second mechanical connection path which fully surrounds the cooling channel. A sealing agent is applied along a second sealing path in order to seal the first casing component against the second casing component. The embodiments can be combined.

Such a method may provide significant advantages over the cited prior art, in particular with regard to providing a cooler to the power semiconductor module. In particular, the method as described may serve for forming an inverter.

With regard to providing a power semiconductor module with a cooler, it may be comprised that this method comprises connecting a part of the cooler to the power semiconductor module, or its baseplate, respectively. For example, and like described in more detail below, it may be comprised that a cooler enclosure which provides the power module and thus its baseplate with a cooling fluid and thus a passive part of the cooler may be attached to the baseplate, whereas further parts, such as a pump, a control unit and the like are not mentioned here in more detail.

As noted above, a power semiconductor module is provided which comprises a substrate and a baseplate. The substrate may particularly be a ceramic substrate which carries power semiconductor devices on a substrate metallization. The power semiconductor devices may thus be fixed to a substrate metallization, for example, and may form, together with other components, such as terminals and respective interconnections, an electric circuit. The baseplate is connected to the substrate in order to provide a cooling effect of the power semiconductor devices so that the power semiconductor module may work in a desired manner.

Thus, whereas the first baseplate side, i.e., the first side of the baseplate, is connected to the substrate, the second baseplate side, i.e., the second side of the baseplate, is adapted for being connected to the cooler, such as a cooler enclosure. With this regard, it is provided that the second baseplate side is equipped with a cooling area which is surrounded by a connecting area. The cooling area thus is the effective part of the baseplate and is thus that part, which should be cooled by the cooler and should in particular come into contact with a cooling fluid which is guided through the cooler. The connecting area, however, is provided for connecting the baseplate to the cooler and thus it is not required and not desired that this area comes into contact with a cooling fluid, for example.

A first casing component of the cooler is connected and thus fixed to the second baseplate side at the connecting area. This is done by welding as described down below. The first casing component may, for example, be formed from a flat plate, which allows an easy manufacturing, such as embossing, for example.

The first casing component comprises at least one opening for receiving the cooling area. In other words, in case the first casing component is attached to the baseplate, the cooling area is still exposed so that it can be cooled by a cooling fluid which flows through the cooler, such as a cooler enclosure.

The second casing component is connected to and thus fixed to the first casing component wherein it is provided that a cooling channel for providing the cooling area with cooling fluid is provided between the first casing component and the second casing component. The cooling channel may be a free volume which is present between the first casing component and the second cooling component or it may have a structure which guides the cooling fluid through defined paths. The first casing component and the second casing component may form a cooler enclosure.

With regard to fixing the first casing component to the baseplate and with regard to fixing the second casing component to the second casing component, the method comprises at least one two steps. For example, the first casing component is fixed to the baseplate or the second casing component is fixed to the first casing component (or both).

The first casing component can be welded to the baseplate by an intermittent welding technique along a first mechanical connection path which fully surrounds the opening. A sealing agent can then be provided along a first sealing path in order to seal the baseplate against the first casing component.

Therefore, it can be seen that the first casing component is not fully welded to the baseplate along the mechanical connection path, but only specific areas of the first casing component are welded to the baseplate whereas further areas of the connection path are not welded to the baseplate. Thus, this step allows mechanically fixing the first casing component to the baseplate without fully welding the connection path.

The second step thus deals especially with the areas along the sealing path which are not welded together and provides a sealing agent which seals the baseplate to the first casing component. This step thus avoids cooling fluid which is in contact with the cooling area to leave the cooler between the baseplate and the first casing part and thus cause a leakage.

The first sealing path may be the same path compared to the first connection path, or it may be a different path. For example, the first sealing path may be essentially parallel to the first connection path and/ or it may be located within or outside the first connection path.

Similarly, the second casing component can be welded to the first casing component by an intermittent welding technique along a second mechanical connection path which fully surrounds the cooling channel and then a sealing agent can be provided along the second sealing path in order to seal the first casing component against the second casing component.

Therefore, it can be seen that the second casing component is not fully welded to the first casing component along the mechanical connection path, but only specific areas of the casing components are welded together whereas further areas of the connection path are not welded together. Thus, this step allows mechanically fixing the first casing component to the second casing component without fully welding the connection path.

The second step deals especially with the areas along the connection path which are not welded together and provides a sealing agent which seals the first casing component to the second casing component. This step thus avoids cooling fluid which is in the cooling channel between the casing elements to leave the cooler between the baseplate and the first casing part and thus cause a leakage.

Again, the second sealing path may be the same path compared to the second mechanical connection path, or it may be a different path. For example, the second sealing path may be essentially parallel to the second connection path and/ or it may be located within or outside the first connection path.

This method thus allows in a very effective manner to provide a cooler at the power semiconductor module which allows a reliable and efficient cooling behavior for the baseplate and thus the power semiconductor module. This is due to the fact that by providing a cooler which is based on a cooling fluid to be used has an efficient cooling behavior so that the power semiconductor module is cooled in a very effective manner.

Apart from that, due to the welding step, a reliable mechanical connection of the casing components to each other as well as to the baseplate may be realized which ensures a long-term reliable arrangement.

Further, due to the provision of a sealant, it may be avoided reliably that cooling fluid leaves the cooler at least at the cooler enclosure being formed of the first and second casing components so that respective damages or reduced cooling capacity can be avoided.

With regard to the casing and thus the first casing component as well as the second casing component, which form the cooler enclosure, it may be provided that the casing components are formed from a metal.

As an example, the casing components may be formed from aluminum. It may generally be provided that the casing components are formed from the same material as thus may enhance the welding conditions.

Generally, the first casing component may serve as a bottom plate and the second casing component may serve as cap, or lid, respectively, for closing the cooling channel.

The method as described before by using a two-step arrangement of welding and sealing allows very gentle conditions for connecting the first casing component to the baseplate and the second casing component to the first casing component. This in turn allows significantly reduced heat influence due to the welding step on the power semiconductor module. The danger of damaging or deteriorating parts of the power semiconductor module due to heat influence can thus be avoided or at least be reduced significantly.

These advantages may be preferred, for example, for sintered substrates or for substrates on which the power semiconductor devices are sintered on, respectively. In fact, substrates for sintering cannot be wire bonded and tested prior to sintering, since the sintering approach requires a strong pressure on the substrates, which is typically applied mechanically with a rubber stamp, which would destroy the wire bonding.

The welding process especially in combination with the gluing process does not affect the power modules functionalities and allows creating a leak tight container without using O-ring and screws. This results in a compact solution with high reliability and high temperature rating.

The temperature influence to the components of the power semiconductor module may further be reduced in case it is provided that at least one of the connecting steps, preferably all of these steps, is performed from the side opposing the baseplate. Therefore, the main heat influence is introduced from the side opposing the power semiconductor module so that the danger of deteriorating components of the power semiconductor module, such as power semiconductor devices, may be further significantly reduced. Further, this step allows using a transfer-molded module like described down below.

In particular, it may be especially preferred that the method comprises intermittent welding and sealing steps for both the first and second casing components. Especially according to this embodiment, it may be realized that the temperature influence due to welding on the further parts is significantly reduced. This may be due to the fact that welding may be reduced to a minimum which also reduces the heat which is exerted to the power semiconductor module.

It may further be provided that welding is performed by means of laser welding. Especially by means of laser welding, the temperature influence to the parts to be welded and thus to the power semiconductor module may be significantly reduced. This may be due to the fact that the temperatures arising when using laser welding may be hold below 250° C. or even below 225° C. Therefore, damages of parts of the power semiconductor module, such as damages of power semiconductor devices, may be prevented or at least reduced so that a module like described above may be realized in a reliable manner.

With regard to the welding steps as described before, it may further be provided that welding is performed by means of tack welding. Tack welding is a welding technique which is generally known in the art in different technical fields. In detail, tack welding is a process which may according to the prior art be used as a temporary means to hold the components in the proper location, alignment, and distance apart, while welding. However, in the present invention, tack welding may be used in order to securely fix the respective parts to another. It is not required to weld the whole connection path as the sealing agent will be applied later, anyhow realizing a clearly sufficient mechanical strength.

Therefore, tack welding is a secure way to provide mechanical stability which is the main part of the welding step in the present invention.

It may further be provided that the cooling area is equipped with a cooling structure before connecting the first casing to the second casing. In another embodiment, a cooling structure is attached to the cooling area after connecting the first casing component to the second casing component and before connecting a second casing component to the first casing component. According to this embodiment, the cooling efficiency of the cooler may further be improved. This may be mainly due to the fact that the surface of the baseplate which can be cooled by the influence of a cooling fluid may be significantly increased.

The cooling structure may be formed, for example, by using cooling pins which are fixed to the baseplate, or which may be part of the baseplate and may thus form a one-part with the baseplate.

According to this embodiment, it may be provided that the first casing component has an opening which is adapted for receiving the cooling structure. Further, the distance between the first casing component and the second casing component may be chosen such, that this distance is greater compared to the length of the cooling structure so that there is sufficient space for placing the cooling structure.

It may further be provided that the sealing agent comprises an adhesive. This embodiment allows an especially reliable and effective measure for fixing the cooler to the power semiconductor device. This may be due to the fact that the sealant not only fulfils the object of effectively and reliably sealing the baseplate against the first casing component and/or the first casing component against the second casing component. Apart from that, the sealant material additionally may assist in providing a mechanical fixation of the baseplate to the first casing component and/or the first casing component to the second casing component. Therefore, especially in case tack welding is performed, the welding areas, such as the welding points may be formed in an especially reduced amount or area, so that heat influence is further reduced. However, nevertheless, the mechanical stability and reliability of the arrangement is not deteriorated. Thus, especially advantageous synergistic effects may be reached.

It may further be provided that at least one of the first casing component and the second casing component comprises at least one of a fluid inlet and a fluid outlet. This embodiment thus allows in a very efficient and simple manner to use the arrangement of the first casing component and the second casing component as a fluid-based cooler. With this regard, it may be realized that the inlet and the outlet are both provided at the first casing component or at the second casing component, or that one of the inlet and the outlet is provided at the first casing component and the further part of the inlet and the outlet is provided at the further part of the inlet and the outlet. However, due to space reasons, it may be preferred that both of the inlet and the outlet are provided at the second casing component which may also be seen as a kind of cap.

Like can be seen above in detail, the proposed invention allows, in a specific embodiment, the integration of modules, such as of three single half-bridge modules, into a common metal frame as first casing component by welding technologies and then welding a cover as second casing component to it in order to create a cooling channel such as a fluid tub without using O-ring and screws. Therefore, an especially simple arrangement may be provided which allows easily providing a cooler to the power semiconductor module.

Apart from that, temperature influence may be reduced which in turn reduced the danger of negatively influencing the power semiconductor devices of the module, for example.

With regard to further advantages and technical features of the method, it is referred to the arrangement, the figures and the further description.

Further described is an arrangement of a power semiconductor module and a cooler, wherein the power semiconductor module comprises a substrate having a first substrate side which carries at least one electric circuit and having a second substrate side being located opposite to the first substrate side, wherein the second substrate side is connected to a first baseplate side, wherein the baseplate further comprises a second baseplate side being located opposite to its first baseplate side and being in contact with the cooler, wherein the second baseplate side is equipped with a cooling area which is surrounded by a connecting area, wherein a first casing component of the cooler is connected to the second baseplate side at the connecting area, wherein the first casing component comprises at least one opening for receiving the cooling area, and wherein a second casing component is connected to the first casing component such, that a cooling channel for providing the cooling area with cooling fluid is provided between the first casing component and the second casing component.

The arrangement is characterized by one or both of the following embodiments. In one embodiment and the second casing component, the first casing component is welded to the baseplate by an intermittent welding technique along a first mechanical connection path which fully surrounds the opening and a sealing agent is provided completely along a first sealing path fully surrounding the opening in order to seal the baseplate against the first casing component. In another embodiment, the second casing component is welded to the first casing component by an intermittent welding technique along a second connection path which fully surrounds the cooling channel and a sealing agent is provided completely along a second sealing path in order to seal the first casing component against the second casing component. These embodiments can be combined.

Such an arrangement may provide significant advantages over solutions of the prior art. Further, the arrangement as described may comprise or form an inverter. Further, such an arrangement may be formed according to a method as described before.

In detail, due to the fact that welding along the first mechanical connection path and/or the second mechanical connection path is performed in an intermittent manner, such as by tack welding, the heat influence to the power semiconductor module and particularly to the power semiconductor devices may be significantly reduced. Thus, the arrangement has an improved producibility.

The power semiconductor module comprises a plurality of power semiconductor devices. Such power semiconductor devices may be generally formed as it is known in the art and may comprise, inter alia, transistors, or switches, respectively, such as MOSFETs and/or IGBTs and/or the plurality of power semiconductor devices may comprise diodes in a non-limiting manner. The power semiconductor devices may be respectively interconnected and may thus be in electrical contact, such as in galvanic contact with the respective areas of the lead frame, such as by soldering or sintering the power semiconductor devices thereon.

In order to allow gentle working conditions of the power semiconductor module and particularly of the power semiconductor devices, the power semiconductor device is connected and thermally coupled to a cooler by means of a baseplate. The cooler thus serves for dissipating heat from the baseplate and thus from the power semiconductor devices.

Therefore, a long-term stable and reliable arrangement of the cooler may be provided which allows a secure working behavior. This may be due to the fact that the fluid-based cooler has an effective cooling capacity.

The baseplate material should be suitable for the chosen welding technology and should also have a surface finishing which does not require coatings, such as nickel, for the galvanic corrosion protection when installed in a cooling circuit. An example of such a material can be a copper/aluminum baseplate with the aluminum part in contact with the cooling media or and AlSiC baseplate, e.g., enriched with aluminum only in the welding area.

It may further be provided that the power semiconductor module is a transfer-molded module. According to this embodiment, significant advantageous effects may be reached.

With this regard, transfer-molded power semiconductor modules have become an interesting alternative to the traditional gel or resin encapsulation approach due to benefits with respect to costs, as no housing is required, due to cycle reliability as it is possible to provide hard mold and low-CTE encapsulation of the power semiconductor devices and respective connections, due to environmental protection as low moisture absorption and vapor diffusion is reached, and further due to vibration, shock and handling properties as well as warpage reduction. Thus, transfer molded modules have significant advantages over solutions of the prior art.

It may further be provided that the power semiconductor module is a three-phase module, which forms an inverter made by three power semiconductor half bridge modules, also called half bridges. Again, this embodiment may show the advantages as described especially effectively, as especially with regard to three-phase modules the connection of a substrate to a cooler was an issue according to the prior art.

With regard to three-phase modules forming an inverter like described above, the following may be noted.

In two-level traction inverters driving a three-phase machine, six functional semiconductor switches are needed. When looking at traction inverters for electric vehicles, for example, the state-of-the-art often comprises a six-pack module integrating three individual phases in a common baseplate or cooler. A typical module of this design is based on a 3-phase pin-fin baseplate, a plastic frame glued to the baseplate.

It is preferred to realize a 3-phase mold module based on three individual mold modules and thus one half-bridge module per phase. In consequence, the mold modules need to be attached to the cooler system after being molded.

With regard to further advantages and technical features of the arrangement, it is referred to the method, the figures and the further description.

Figure 8:
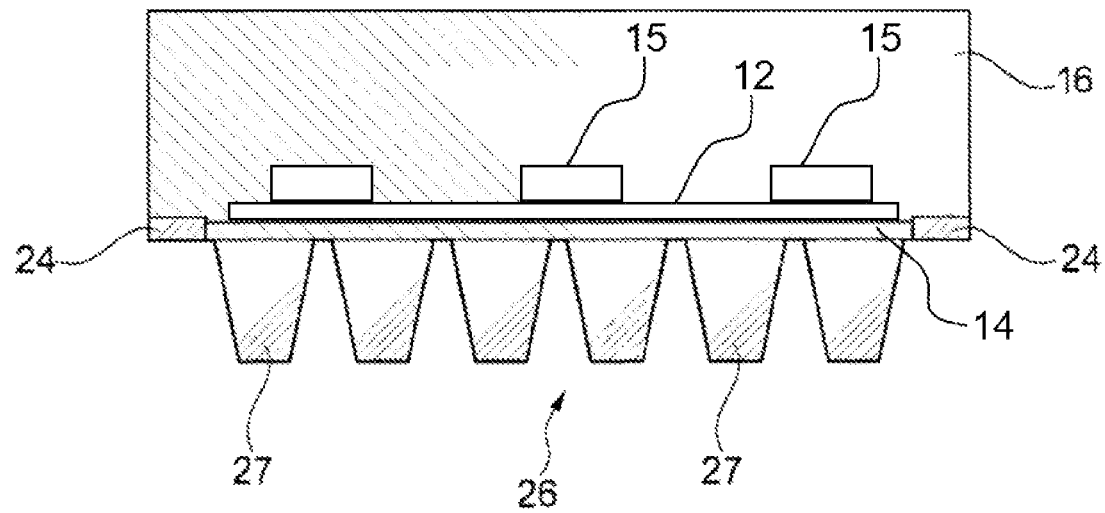
FIG. 8 shows a side-view of a baseplate with a cooling structure.

Referring now to the drawings, FIG. 1 shows a power semiconductor module 10 which should be provided with a cooler by using a method according to the invention like shown in greater detail down below. FIG. 8 shows a side-view of the power semiconductor module 10.

The power semiconductor module 10 comprises a substrate 12 having a first substrate side which carries at least one electric circuit 15 and having a second substrate side being located opposite to the first substrate side, wherein the second substrate side is connected to a first baseplate side. The electric circuit 15 of the power semiconductor module 10 comprises power semiconductor devices which may be sintered to the substrate and which are not shown in FIG. 1, as the power semiconductor module 10 is a transfer-molded module. Thus, a mold compound 16 is shown which encapsulates the electric circuit 15. FIG. 8 view shows the substrate 12 and electric circuits 15 that are within the mold compound 16. However, terminals 18 for externally contacting the electrical circuit are shown to proceed out of the mold compound 16.

The baseplate 14 comprises a second baseplate side 20, which is adapted for being in contact with the cooler and in particular with a cooler enclosure which comprises a cooling channel and which thus provides the baseplate 14 with cooling fluid. Thus, the cooler and in more detail the cooler enclosure will be connected to the second baseplate side 20.

The second baseplate side 20 is equipped with a cooling area 22 which is surrounded by a connecting area 24. The cooling area 22 is adapted for coming in contact with a cooling fluid and the connecting area 24 is adapted for being fixed to the cooler enclosure.

It is further shown that the cooling area 22 is equipped with a cooling structure 26 which is formed from a plurality of cooling pins 27. This is shown in more detail in FIG. 8.

Such a power semiconductor module 10 may, e.g., be a half-bridge module and may be part of a three-phase inverter as it is often required for vehicles, for example.

In order to provide a cooler to the power semiconductor module 10, it is provided to connect a first casing component 28 of the cooler to the second baseplate side 20 at the connecting area 24. In order to allow the cooling structure 26 to be active in a working condition of the cooler 22, the first casing component 28 comprises an opening 30 for receiving and surrounding the cooling area 22 and thus the cooling structure 26.

Figure 2:
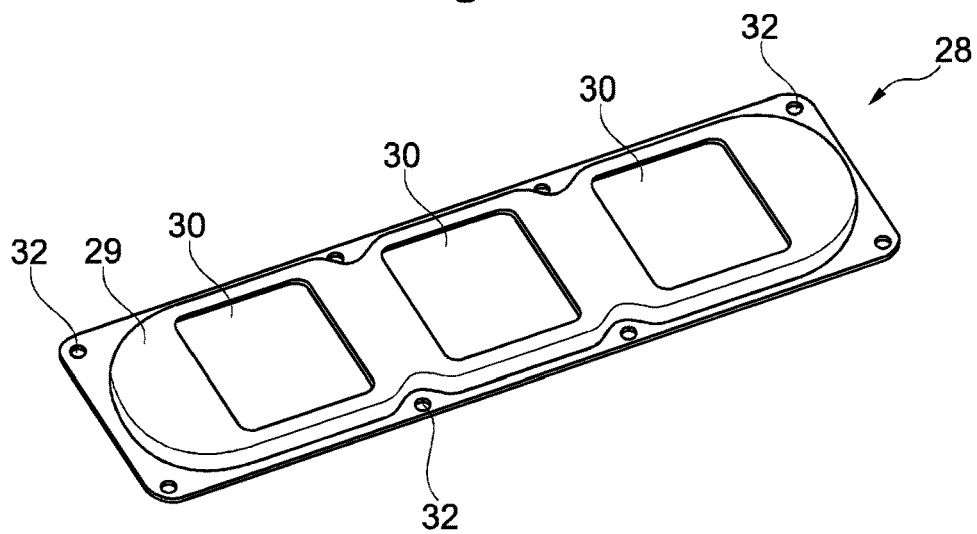
FIG. 2 shows an embodiment of a first casing component.

Such a first casing component 28 is shown in FIG. 2. It is shown that the first casing component 28 comprises three openings 30 which may be adapted for receiving three power semiconductor modules 10, such as three half-bridge modules. Further shown are holes 32 for fixing the arrangement of cooler and power semiconductor module 10 to a support.

Figure 3:
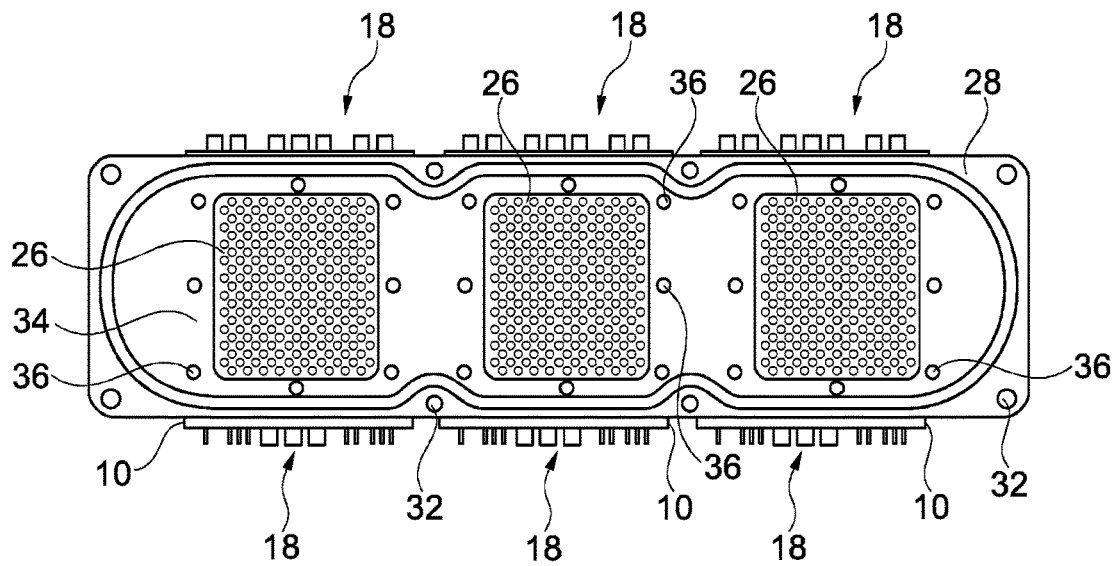
FIG. 3 shows an arrangement of a first casing component fixed to the power semiconductor module after a welding step.

FIG. 3 shows a top view onto the first casing component 28 which is fixed to the power semiconductor module 10, or its baseplate 14, respectively, by a first step, i.e., by an intermittent welding step. This step may be performed by a tack welding process and/or by means of laser welding.

In more detail, it is shown that the first casing component 28 is fixed to the baseplate 14 by an intermittent welding technique along a first mechanical connection path 34 which fully surrounds the opening 30. Thus, welding areas 36 are formed which have the form of spots, for example.

Figure 4:
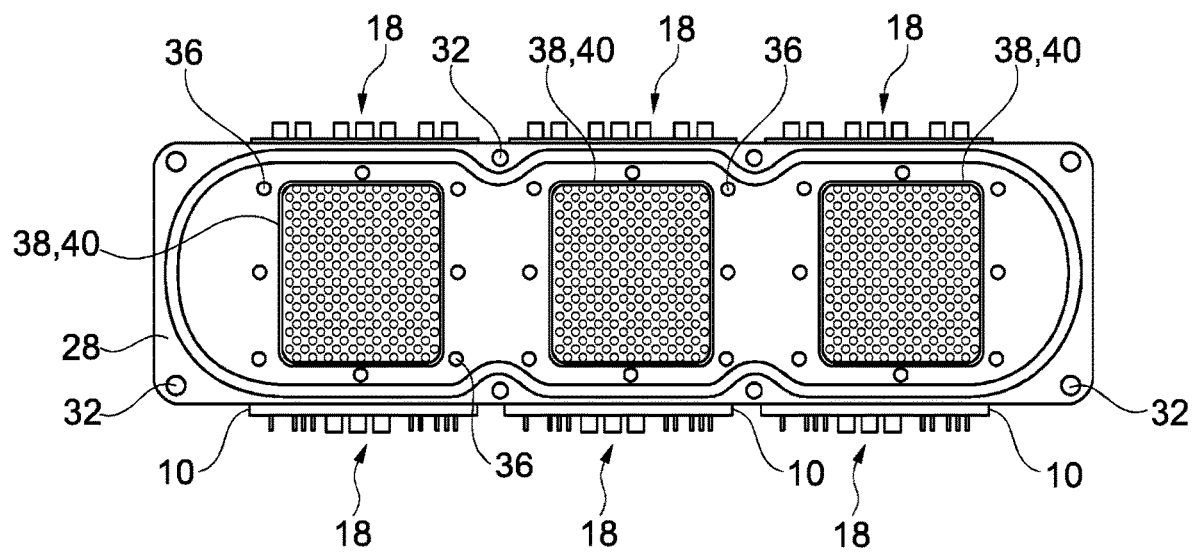
FIG. 4 shows an arrangement of a first casing component fixed to the power semiconductor module after a sealing step.

FIG. 4 shows a further view onto the first casing component 28 in which it can be seen that a sealing agent 38, such as an adhesive, is provided along a first sealing path 40 which fully surrounds the opening 30 in order to seal the baseplate 14 against the first casing component 28.

Such an arrangement of a respective welding structure together with a sealing structure is shown in a correspondent manner for all three openings 30 and thus for all power semiconductor devices 10.

Figure 5:
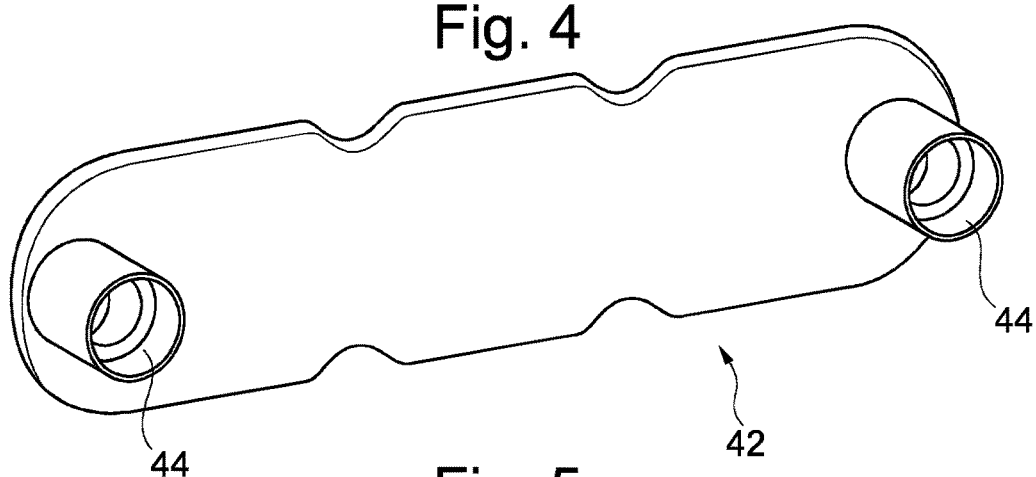
FIG. 5 shows an embodiment of a second casing component.

In order to form the cooler enclosure, it is further provided that a second casing component 42 is connected to the first casing component 28. In other words, the first casing component 28 and the second casing component 42 form the cooler enclosure. The second casing component 42 is shown in FIG. 5 in which it is shown, that the second casing component 42 comprises two openings 44, which may serve as inlet and outlet for guiding cooling fluid through the cooler. The first casing component 28 and the second casing component 42 may be formed from the same material to enhance welding.

Figure 6:
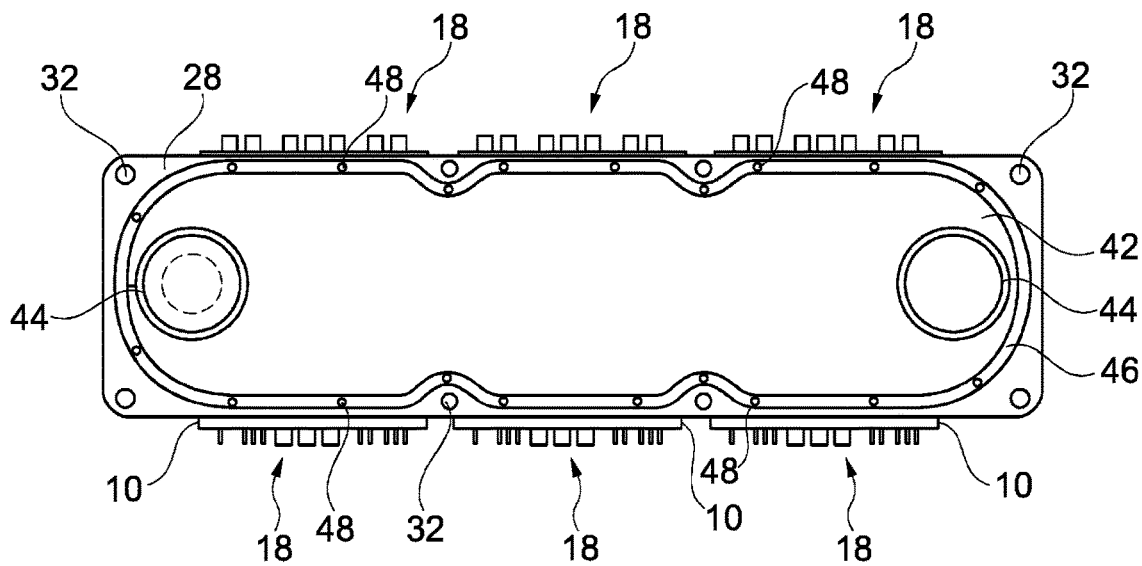
FIG. 6 shows an arrangement of a second casing component fixed to the first casing component after a welding step.

In more detail and like shown in FIG. 6, it is provided that the second casing component 42 is fixed to the first casing component 28 such, that a cooling channel for providing the cooling area 22 with cooling fluid is provided between the first casing component 28 and the second casing component 42. This is realized in that the second casing component 42 is welded to the first casing component 28 by an intermittent welding technique along a second mechanical connection path 46 which fully surrounds the cooling channel. Again, this step may be realized by a tack welding process and/or by means of laser welding. However, in a general manner, it may be provided that this welding step is performed by means of friction stir welding, laser welding and cold metal transfer since the requirements in terms of maximum temperature and mechanical stresses are less challenging compared to the welding step of fixing the first casing component 28 to the baseplate 14.

Coming back to the latter welding step of fixing the first casing component 28 to the baseplate 14, the material for the baseplate 14 may be chosen as the best compromise between thermal performances, reliability, corrosion resistance and weldability. The latter point may be of high relevance. In order to avoid brittle intermetallic phases, the material of the baseplate 14 at the welding interface and thus at the connection area 24 may be as well aluminum. Taking all these constraints into account, a possible option could be to use an aluminum-clad copper plate or an AlSiC baseplate 14 with an aluminum enriched area, where the welding is performed and thus at the connection area.

This welding step of the second casing component 42 to the first casing component 28 again results in welding areas 48 to be formed which again are formed as spots, for example.

Figure 7:
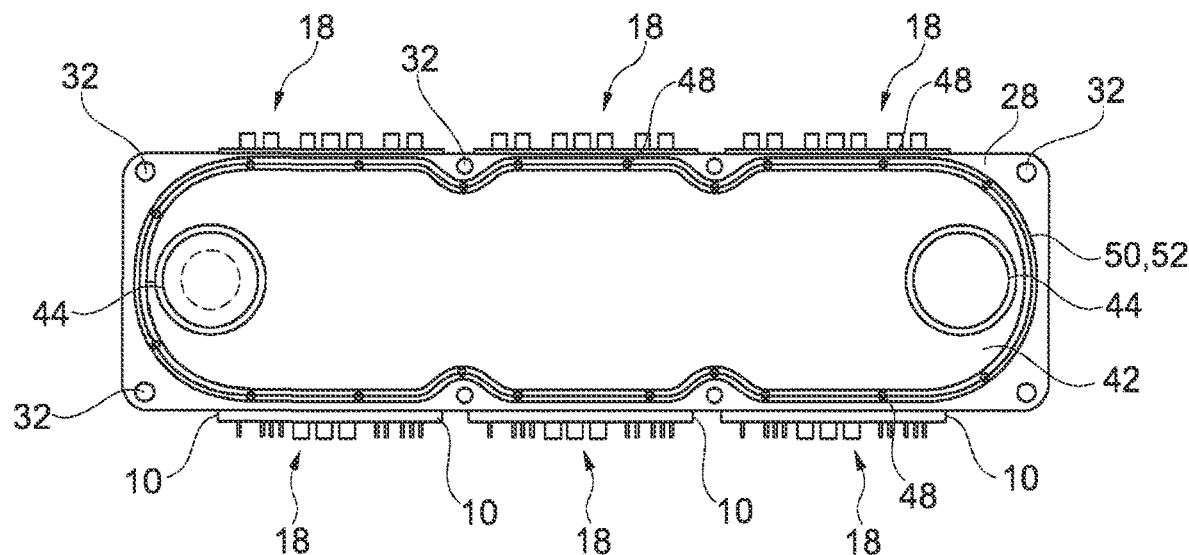
FIG. 7 shows an arrangement of the second casing component fixed to the first casing component after a sealing step.

According to a further step and like shown in FIG. 7, it is provided that a sealing agent 50 is provided along a second sealing path 52 in order to seal the first casing component 28 against the second casing component 42. After having performed this step, the cooler enclosure is provided at the power semiconductor module 10.

Coming back to FIG. 2, it can be seen that the first casing component 28 comprises an elevation 29, which may form the cooling channel in case the first casing component 28 is fixed to the second casing 42 component as shown above. In this case, the first casing component 28 may form a kind of cooling tub, which is closed by the second casing component 42.

To summarize and according to a preferred embodiment, a solution is obtained for manufacturing a six-pack inverter for, e.g., electric vehicles based on three separated half bridges modules with transfer mold and sintered substrate. This is realized by combining welding and gluing technologies. The weld is an intermittent line along a loop-shaped path and or maybe, i.e., consist of individual line segment, or even just spots. Such a technique is used in tack welding. Tack welding is often used as a temporary weld performed during the fitup of a part. This is usually done to ensure dimensional stability before the actual welding starts. In the proposed solution the mechanical integration of the three half bridge modules as power semiconductor modules 10 into a common metal frame as first casing component 28 is done in two steps.

According to a first step, welding is performed by laser welding or any other welding which allows to keep the temperature below 225° C. and avoid mechanical stresses. The target of this process is to hold the parts in proper alignment and to provide mechanical bond between power module baseplates 14 and frame or first casing component, respectively.

According to a second step, a suitable glue, compatible with the working fluid and boundary conditions, such as temperature, is dispensed along the interfaces between the half bridge baseplates 14 and the metal cover. The target of this process is to provide the leak tightness between the glued parts. Examples for adhesive glue materials are in a general manner silicones, epoxides, polyimides, acrylics, and urethanes.

The same two steps process is then repeated for the frame to cover joint with the difference that, in such a case, also different welding technologies can be used since the temperature constrain is not as severe as for the baseplate to frame joint.

Generally, this invention combines the advantages of good mechanical stability of the welding process with a high leak tightness of the sealing agent. Thus, it can be avoided that only using welding leads to leakages due to erroneous welding processes.

Further, O-rings and screws can be avoided leading to an especially high leak tightness and to easy production processes.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A method of providing a power semiconductor module with a cooler, the method comprising:
   a) providing a power semiconductor module that comprises a substrate having a first substrate side for carrying at least one electric circuit and having a second substrate side being located opposite to the first substrate side, wherein the second substrate side is connected to a first baseplate side, wherein the baseplate further comprises a second baseplate side being located opposite to its first baseplate side and being adapted for coming in contact with the cooler, wherein the cooler comprises a first casing component and a second casing component, wherein the second baseplate side is equipped with a cooling area which is surrounded by a connecting area;
   b) connecting the first casing component to the second baseplate side at the connecting area, wherein the first casing component comprises at least one opening for receiving the cooling area;
   c) connecting a second casing component to the first casing component such, that a cooling channel for providing the cooling area with cooling fluid is provided between the first casing component and the second casing component;
   wherein the method comprises at least one of the steps b100) and c100),
   wherein according to the step b100), step b) comprises the steps of
      b1) welding the first casing component to the baseplate by an intermittent welding technique along a first mechanical connection path which fully surrounds the opening; and
      b2) providing a sealing agent along a first sealing path which fully surrounds the opening in order to seal the baseplate against the first casing component; and
   wherein according to the step c100), step c) comprises the steps of
      c1) welding the second casing component to the first casing component by an intermittent welding technique along a second mechanical connection path which fully surrounds the cooling channel; and
      c2) providing a sealing agent along a second sealing path in order to seal the first casing component against the second casing component.

2. The method according to claim 1, wherein the method comprises performing both the steps b1) and b2).

3. The method according to claim 1, wherein welding in at least one of steps b1) and b2) is performed by means of laser welding.

4. The method according to claim 1, wherein welding in at least one of steps b1) and b2) is performed by means of tack welding.

5. The method according to claim 1, wherein at least one of the steps b1) and b2) is performed from a side opposing the baseplate.

6. The method according to claim 1, wherein the cooling area is equipped with a cooling structure before step b), or in that a cooling structure is attached to the cooling area after step b) and before step c).

7. The method according to claim 1, wherein the sealing agent comprises an adhesive.

8. The method according to claim 1, wherein at least one of the first casing component and the second casing component comprises at least one of a fluid inlet and a fluid outlet.

9. An arrangement of a power semiconductor module and a cooler, wherein the power semiconductor module comprises a substrate having a first substrate side which carries at least one electric circuit and having a second substrate side being located opposite to the first substrate side, wherein the second substrate side is connected to a first baseplate side, wherein the baseplate further comprises a second baseplate side being located opposite to its first baseplate side and being in contact with the cooler, wherein the second baseplate side is equipped with a cooling area which is surrounded by a connecting area, wherein a first casing component of the cooler is connected to the second baseplate side at the connecting area, wherein the first casing component comprises at least one opening for receiving the cooling area, and wherein a second casing component is connected to the first casing component such that a cooling channel for providing the cooling area with cooling fluid is provided between the first casing component and the second casing component, wherein at least one of the features i) and ii) is provided, wherein according to the feature i), the first casing component is welded to the baseplate by an intermittent welding technique along a first mechanical connection path which fully surrounds the opening and a sealing agent is provided completely along a first sealing path fully surrounding the opening in order to seal the baseplate against the first casing component, and wherein according to the feature ii), the second casing component is welded to the first casing component by an intermittent welding technique along a second connection path which fully surrounds the cooling channel, and a sealing agent is provided completely along a second sealing path in order to seal the first casing component against the second casing component.

10. The arrangement according to claim 9, wherein the power semiconductor module is a transfer molded module.

* * * * *